United States Patent [19]

Yamaguchi

[11] Patent Number: 5,375,083
[45] Date of Patent: Dec. 20, 1994

[54] SEMICONDUCTOR INTEGRATED CIRCUIT INCLUDING A SUBSTRATE HAVING A MEMORY CELL ARRAY SURROUNDED BY A WELL STRUCTURE

[75] Inventor: Atsuo Yamaguchi, Itami, Japan

[73] Assignee: Mitsubishi Denki Kabushiki Kaisha, Tokyo, Japan

[21] Appl. No.: 13,721

[22] Filed: Feb. 4, 1993

[51] Int. Cl.$^5$ .............................................. G11C 11/34
[52] U.S. Cl. ........................................ 365/63; 365/900; 365/185; 365/182; 365/181; 257/371; 257/372
[58] Field of Search ................. 365/63, 900, 185, 181, 365/182; 257/314, 315, 371, 372

[56] References Cited

U.S. PATENT DOCUMENTS

| | | | |
|---|---|---|---|
| 4,907,058 | 3/1990 | Sakai | 257/371 |
| 5,202,579 | 4/1993 | Fujii et al. | 257/751 |
| 5,319,604 | 6/1994 | Imondi et al. | 365/230.06 |

FOREIGN PATENT DOCUMENTS

| | | |
|---|---|---|
| 64-52298 | 2/1989 | Japan . |
| 64-53400 | 3/1989 | Japan . |
| 1102662 | 4/1989 | Japan . |
| 1151100 | 6/1989 | Japan . |
| 1192100 | 8/1989 | Japan . |
| 3181096 | 8/1991 | Japan . |

*Primary Examiner*—Eugene R. LaRoche
*Assistant Examiner*—Huan Hoang
*Attorney, Agent, or Firm*—Leydig, Voit & Mayer

[57] ABSTRACT

An object of the present invention is to provide a semiconductor integrated circuit in which an EEPROM is incorporated in a highly integrated microcomputer having a twin well structure. A twin well region including an n-well region, a p-well region, and a p-type substrate region surrounded by a p-well region are produced in a single semiconductor substrate. A supply voltage system made up of a CPU, a ROM or RAM, a UART, and EEPROM control systems to which the high voltage for the EEPROM is not applied is formed in the twin well region as a CMOS structure, enabling high density integration. A high-voltage system made up of an EEPROM memory cell array and an EEPROM peripheral high-voltage system in the p-type region have an NMOS structure. This arrangement minimizes the substrate effect and enables the high-voltage system to operate normally.

2 Claims, 10 Drawing Sheets

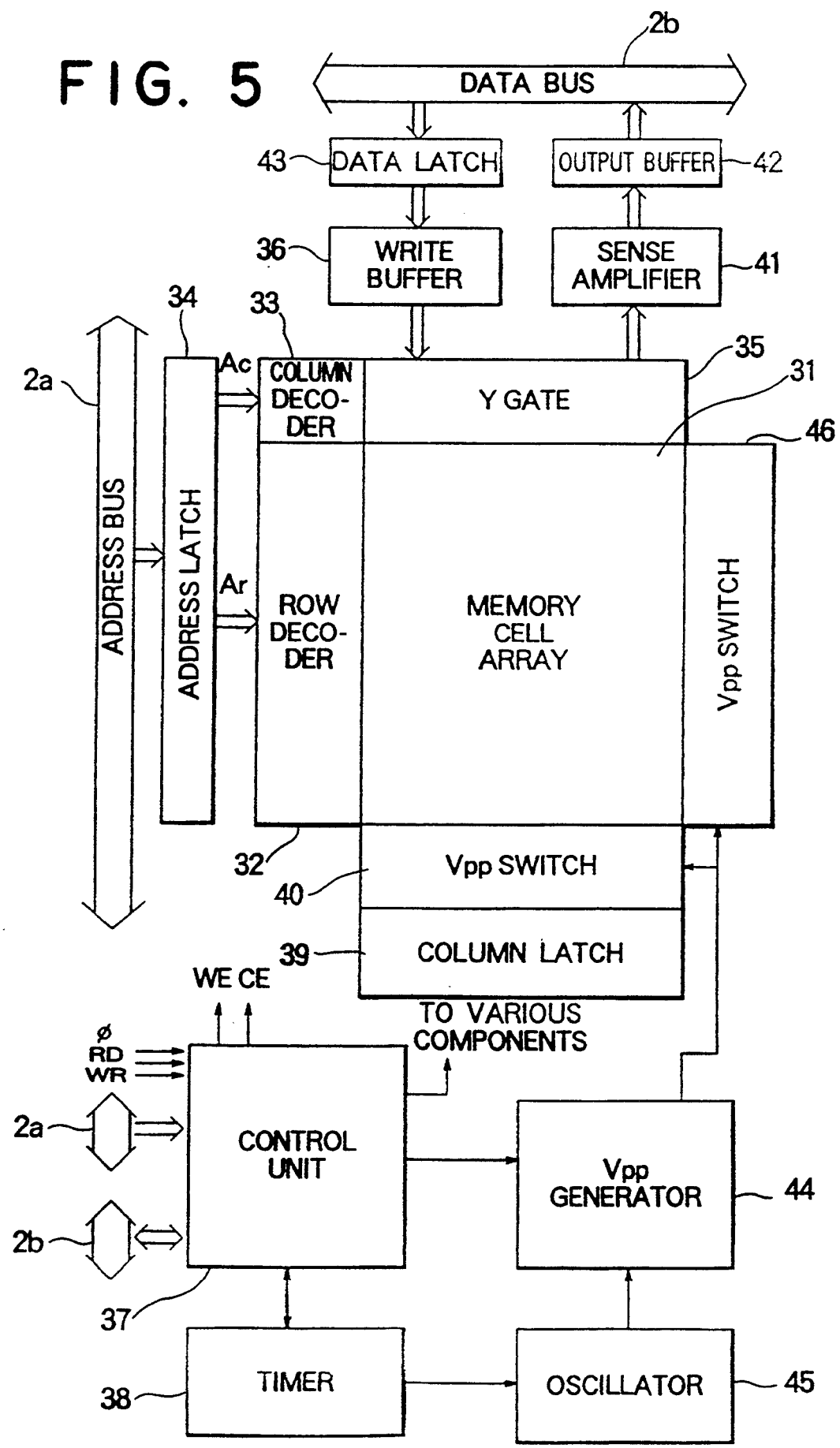

SEMICONDUCTOR INTEGRATED CIRCUIT INCLUDING A SUBSTRATE HAVING A MEMORY CELL ARRAY SURROUNDED BY A WELL STRUCTURE

BACKGROUND OF THE INVENTION

1. Field of the Invention

The present invention relates to a semiconductor integrated circuit, in particular, a semiconductor integrated circuit for a microcomputer having, for example, a built-in EEPROM.

2. Description of the Related Art

Referring to FIGS. 4 to 9 and taking a semiconductor integrated circuit for a microcomputer having a built-in EEPROM as an example, the constructions and operations or the EEPROM and its peripheral circuits will be described.

FIG. 4 is a block diagram which schematically shows the construction of an IC card microcomputer having a built-in electrically erasable programmable read only memory (EEPROM). In FIG. 4, 10 denotes an IC card or a microcomputer for data processing. In the microcomputer 10, 1 denotes a central processing unit (CPU) that performs computation and control necessary for data processing; that is, executes and controls programs for data processing. 4 denotes a ROM serving as a program memory that contains programs necessary for data processing; that is, programs for executing various functions a card user uses in practice. 5 denotes a nonvolatile EEPROM serving as a personal information memory in which card user's personal information are written. 6 denotes a RAN serving as a temporary memory that contains data necessary for data processing temporarily. 7 denotes an input/output circuit serving as an input/output unit for inputting and outputting data from and to external units. 2 denotes a system bus for interconnecting the above components. P1 represents a positive power supply input pin. P2 represents a negative power supply ground pin. P3 represents a reset pin for inputting a reset signal that initializes the CPU 1. P4 represents a clock pin for inputting a clock signal. P5 represents an input/output pin for inputting and outputting data. The input/output pin P5 is connected with the input/output circuit 7. The input/output circuit 7 is connected to the system bus 2. The input/output circuit 7 inputs and outputs data from and to external units (not shown) via the input/output pin P5.

FIG. 5 is a block diagram showing an overall construction of an EEPROM. In FIG. 5, 31 denotes a memory cell array in which memory cells are arranged in the form of a matrix (See FIGS. 6 and 7), and connected to word lines in rows and to bit lines in columns (See FIG. 7). 2a denotes an address bus, and 2b, a data bus. These buses are included in a system bus. A word line is selected by a row decoder 32, while a bit line is selected by a column decoder 33. The row decoder 32 sets a word line at a high level and the other word lines at a low level according to a row address Ar fetched via an address latch 34. The column decoder 33 selectively turns on a Y gate 35 according to a column address Ac fetched via the address latch 34, thus electrically coupling a write buffer 36 and a bit line. The row decoder 32 and column decoder 33 are activated or inactivated under the control of a control unit 37. The address latch 34 fetches an address signal on the basis of an output of the control unit 37, and outputs a row address Ar and a column address Ac to the row decoder 32 and column decoder 33.

The control unit 37 uses a timer 38 to set the duration of a given pulse, and controls the activation or inactivation of an oscillator 45, a Vpp generator 44, a column latch 39, Vpp switches 40 and 46, a sense amplifier 41, the row decoder 32, and the column decoder 33. Based on a control clock signal $\phi$ and a write signal WR, the control unit 37 causes the data latch 43 to latch data to be written over the data bus 2b, then supplies the data to the write buffer 36.

When activated, the column latch 39 latches or temporarily holds write data placed on bit lines. When activated, the Vpp switches 44 and 46 boost the high-level signals on a bit line or a control gate line connected to the column latch 39 (See FIG. 7), and a word line connected to the row decoder 32 up to a high voltage Vpp. When activated, the sense amplifier 41 amplifies the data of a memory cell included in the memory cell array 31, and supplies the amplified data to the output buffer 42. Based on the output of the control unit 37, the output buffer 42 places data read from the sense amplifier 41 as read data on the data bus 2b. The control unit 37 controls the address latch 34 and output buffer 42 on the basis of the control clock signal $\phi$ and read signal RD.

FIGS. 6A and 6B show a memory cell included in a memory cell array 31 of an EEPROM shown in FIG. 5. FIG. 6A shows a cross-sectional structure. FIG. 6B shows an equivalent circuit of FIG. 6A. As shown in FIGS. 6A and 6B, the memory cell is made up of a memory transistor MQ and a selection transistor SQ. As shown in FIG. 6A, n+ diffused regions 21 to 23 are formed by selectively diffusing n-type impurities into a p-type semiconductor substrate 20. 29 denotes an insulating layer. A gate 24 is disposed between the n+ diffused regions 21 and 22, and separated from the n+ diffused regions 21 and 22 by an oxide film 47. A floating gate 25 is disposed between the n+ diffused regions 22 and 23 extending from above part of the n+ diffused region 22, and is separated from the n+ diffused regions 22 and 23 by an oxide film 48. The portion of the floating gate 25 above the n+ diffused region 22 has a concave structure. The oxide film 48 beneath the concave portion serves as a tunnel oxide film 48a about 100 angstroms thick. A control gate 26 is disposed above the floating gate 25 with an oxide film 49 between and has a concave portion in the same manner as the floating gate 25. A bit line 28 made of an aluminum layer extends from the n+ diffused region 21.

In the memory cell having the foregoing construction, as shown in FIG. 6B, an enhancement-mode selection transistor SQ is connected in series with a memory transistor MQ whose threshold voltage is variable. That is to say, the selection transistor SQ uses the gate 24 as the gate, the n+ diffused region 21 as the drain, and the n+ diffused region 22 as the source. The memory transistor MQ is configured using the floating gate 25 and the control gate 26 as the gate, the n+ diffused region 22 as the drain, and the n+ diffused region 23 as the source.

Writing in the memory transistor MQ is, in principle, achieved as follows: an electric field of about 10 MV/cm is developed on the tunnel oxide film 48a by applying a high voltage to either the drain 22 or control gate 26, and grounding either of the drain 22 or control gate 26 to which a high voltage is not applied, so that electrons are injected at or drained from the floating gate 25. Specifically, when electrons are injected at the floating gate 25 of the memory transistor MQ, the threshold voltage shifts to be positive. When electrons are drained from the floating gate 25, the threshold voltage shifts to be negative. The positive and negative threshold voltages are represented as information 1 or 0. Thereby, nonvolatile writing is accomplished.

On the other hand, reading information from the memory transistor MQ is, in principle, achieved as follows: a high-level signal is applied to the gate 24 of the selection transistor SQ of a selected memory cell, the source 23 of the memory transistor MQ is set to the ground potential, and then a read voltage VCG of, for example, about 0 V is applied to the control gate 26. At this time, if the threshold voltage of the memory transistor MQ is positive, the memory transistor MQ is turned off. If the threshold voltage is negative, the memory transistor MQ is turned on. When the memory transistor MQ is turned on, current flows from the bit line 28 into the ground level via the selection transistor SQ and memory transistor MQ. The sense amplifier 41 (See FIG. 5) connected to the bit line 28 converts the current into a voltage. Thus, a signal is detected, and reading is accomplished. The gate 24 of a selection transistor SQ of a memory cell that is not selected is provided with a low-level signal. This turns off the memory transistor MQ. Therefore, even when the memory transistor MQ has a negative threshold voltage, current will not flow from the bit line 28 to the ground level.

FIG. 7 is a circuit diagram showing construction of peripheral circuits of a memory cell array 31 of the EEPROM shown in FIG. 5. In FIG. 7, four 1-bit 1-byte memory cells MC1, MC2, MC3, and MC4 alone are shown for simplification. In the following description, signal lines and signals running on the signal lines are expressed with the same numerals. The memory cells MC1 to MC4 are, as shown in FIG. 6, made up of memory transistors MQ1, MQ2, MQ3, and MQ4, and selection transistors SQ1, SQ2, SQ3, and SQ4. The drains of the selection transistors SQ1 and SQ2 are connected to a bit line BL1. The drains of the selection transistors SQ1 and SQ2 are connected to a bit line BL2. The sources of the memory transistors MQ1 and MQ2 are connected to a source line SL1. The sources of the memory transistors MQ3 and MQ4 are connected to a source line SL2.

The source lines SL1 and SL2 are grounded via transistors T51 and T52 whose gates are provided with a reverse program cycle selection signal $\overline{PRS}$. The control gates of the memory transistors MQ1 and MQ2 are connected to a control gate line CGL1 via byte selection transistors T1 and T2. Similarly, the control gates of the memory transistors MQ3 and MQ4 are connected to a control gate line CGL2 via byte selection transistors T3 and T4. The gates of the transistors T1 and T3, and those of the selection transistors SQ1 and SQ3 are connected to a word line WL1. The gates of the transistors T2 and T4, and those of the selection transistors SQ2 and SQ4 are connected to a word line WL2. Ends of the word lines WL1 and WL2 are connected to a row decoder 32 via high-voltage cutoff transistors T5 and T6 whose gates are provided with a supply voltage Vcc.

Ends of bit lines BL1 and BL2, and those of the control gate lines CGL1 and CCL2 are connected to column latches 39a, 39b, 39c, and 39d via transistors T7, T8, T9, and T10. The other ends of the control gate lines CCL1 and CGL2 are connected to a common control gate line CCGL via Y-gate transistors T61 and T62. The other ends of the bit lines BL1 and BL2 are connected to an input/output line I/O via Y-gate transistors T71 and T72. The gates of the transistors T61 and T71 are connected to an output line CDL1 of a column decoder 33. Similarly, the gates of the transistors T62 and T72 are connected to an output line CDL2. The common control gate line CCGL is connected to a buffer BF1. The input/output line I/O is connected to a write buffer 36 and to a sense amplifier 41. The control gate lines CGL1 and CGL2, the bit lines BL1 and BL2, and the word lines WL1 and WL2 are connected to Vpp switches 40a to 40d, 46e, and 46f. The Vpp switches 40a to 40d, 46e, and 46f are connected to a high-voltage line VPPL over which a high voltage of about 15 to 20 V is supplied. The Vpp switches 40a to 40d, 46e, and 44f fetch erasing clock signals CLKE, program clock signals CLKP, and word line clock signals CLKW. In response to these clock signals, the connected control gate lines CGL1 and CGL2, bit lines BL1 and BL2, and word lines WL1 and WL2 are boosted to a high voltage Vpp when they are high. Even when the word lines WL1 and WL2 are boosted to the high voltage Vpp, the transistors T5 and T6 whose gates are provided with a supply voltage Vcc prevents the high voltage Vpp from entering the row decoder 32.

A bit signal transfer control signal BTTR is fed to the gates of the transistors T7 and T8. A control gate signal transfer control signal CGTR is fed to the gates of the transistors T9 and T10. When these signals are high, signals are transferred between the bit line BL1 or BL2, or the control gate line CGL1 or CGL2, and the column latch 39a, 39b, 39c, or 39d. Even when the bit line BL1 or BL2, or the control gate line CGL1 or CGL2 is boosted to the high voltage Vpp, since the gates of the transistors T7 to T10 are at the level of Vcc, the high voltage Vpp will not be applied to the column latch 39a, 39b, 39c, or 39d.

Transistors 11 and 12 are connected to the control gate lines CGL1 and CGL2. A control gate line reset signal CRGST is fed to the gates of the transistors T11 and T12. When the control gate line reset signal CRGST is driven high, the control gate lines CGL1 and CGL2 become low. Transistors T13 and T14 are connected to the bit lines BL1 and BL2. A bit line reset signal BTRST is fed to the gates of the transistors T13 and T14. When the bit line reset signal BTRST is driven high, the bit lines BL1 and BL2 become low.

Transistors T15 and T17 are connected to the bit lines BL1 and BL2. Transistors T16 and T18 are connected to the transistors T15 and T17. The gates of the transistors T15 and T17 are connected with the column latches 39a and 39b. A pre-charge signal PRCH is fed to the gates of the transistors T16 and T18. When the signals at the column latches 39a and 39b are high, if the pre-charge signal PRCH is driven high, the bit lines BL1 and BL2 become high.

The reverse program cycle selection signal PRS, control gate line reset signal CGRST, bit line reset signal BTRST, control gate signal transfer control signal CGTR, bit signal transfer control signal BTTR, and pre-charge signal PRCH are driven by buffers BF2, BF3, BF4, BF5, BFG, and BF7.

Next, referring to FIG. 7, an EEPROM reading operation will be described. First, a row decoder 32 and a column decoder 33 select a word line WL, a control gate line CGL. and a bit line BL. Herein, it is assumed that a memory cell MC1 is specified because a word line WL1 is selected, and a control gate line CGL1 and a bit line BL1 are selected by turning on transistors T61 ant T72. A reverse program cycle selection signal $\overline{PRS}$ is driven high, and source lines SL1 and SL2 are grounded. A control unit 37 inactivates column latches 30a to 30d, Vpp switches 40a to 40d, 46e, and 46f, and a write buffer 36. Then, the control unit 37 causes a buffer BF1 to place 0V on a common control gate line CCGL, so that the 0 V will be applied to a control gate of a memory transistor MQ1 via a transistor T61 and a transistor T1. At this time, the memory transistor MQ1 is turned off when its threshold voltage is positive. The memory transistor MQ1 is turned on when its threshold voltage is negative. Depending on the on or off state of the memory transistor MQ1, the presence or absence of current flowing over the bit line BL1 is detected as a potential variation in an input/output line I/O by a sense amplifier 41. The sense amplifier outputs a read signal in which the potential variation is amplified. Thus, reading is achieved.

FIG. 9 is a timing chart showing various signal waveforms during EEPROM writing. Referring to FIGS. 5 to 7, and 9, a writing operating will be described on the assumption that a memory cell MC1 is selected. First, when a latch signal LATCH is driven high with a latch start signal WE, a latch cycle starts. At the start of the latch cycle, a control unit 37 activates column latches 39a to 39d, a column decoder 33, and a write buffer 36. Then, a common control gate line CCGL is driven high. On the other hand, a row decoder 32 and a sense amplifier 41 are inactivated under the control of the control unit 37.

When the latch signal LATCH is high, transistors T61 and T72 selected by the column decoder 33 are turned on. Then, data in a data latch 43 (information 0 represents a high level, while information 1 represents a low level) is latched by a column latch 39b after passing through the write buffer 36, an input/output line I/O, a bit line BL1, and a transistor T7. A high-level signal is latched by the column latch 39a after passing through the common control gate line CCGL and a control gate line CGL1. Next, when a write start signal CE is driven high temporarily, the signal LATCH becomes low. Then, an erasing cycle signal ERS rises to start an erasing cycle. When the erasing cycle signal ERS is high, the erasing cycle is under way. When a program cycle selection signal PRS (i.e. a reverse signal of a reverse program cycle selection signal $\overline{PRS}$) is high, a program cycle is under way. The control unit 37 uses a timer 38 to set the pulse durations of the high-level signals ERS and PRS to given values.

During an erasing cycle, the control unit 37 activates the row decoder 32. The row decoder 32 sets only a word line WL1 to a high level. The control unit 37 inactivates the column decoder 33. When a high voltage Vpp having a pulse duration of about 4 milliseconds is placed on a high-voltage line VPPL, the high voltage Vpp is applied to Vpp switches 40a to 40d, 46e, and 46f. Then, the control unit 37 causes a high-frequency oscillator made up of an oscillator 45 and a Vpp generator 44 to supply an erasing clock CLKE having a high frequency of several megahertz and a word line clock signal CLKW to the Vpp switches 40a and 40b, and 46e and 46f. Since the reverse program cycle selection signal $\overline{PRS}$ is high, the source lines SL1 and SL2 are grounded. In this setting, the Vpp switches 40a and 46e boost the high-level signals on the word line WL1 and control gate line CGL1 to a high voltage Vpp. Then, charge carrier tunneling occurs between the floating gate 25 (See FIG. 6) and the drain region (n+ diffused region 22) of the memory transistor MQ1. Electrons are injected at the floating gate 25, and the threshold voltage of the memory transistor MQ1 shifts to be positive (information 1 is stored). When the erasing cycle is completed, the potential of the control gate line CGL1 reset to a low level.

Next, the erasing cycle signal ERS rises, and the precharge signal PRCH becomes high. After that, the program cycle selection signal PRS rises to start a program cycle. The control unit 37 inactivates a word line clock signal CLKW and an erasing clock signal CLKE, and causes the high-frequency oscillator to supply a high-frequency program clock signal CLKP having a frequency of several megahertz and a word line clock signal CLKW to the Vpp switches 40c and 40d, and 46e and 46f. At this time, since the reverse signal $\overline{PRS}$ is low, the source line SL1 is floating. In this setting, if a high-level signal is latched by the column latch 39a, the word line WL1 and bit line BL1 are boosted to a high voltage Vpp. Charge carrier tunneling occurs between the floating gate 25 (See FIG. 6) and the drain region (n+ diffused region 22) of the memory transistor MQ1. Thereby, electrons are drained from the floating gate 25, and the threshold voltage of the memory transistor MQ1 shifts to be negative (information 0 is stored). On the other hand, if the column latch 39a latches a low-level signal, only the word line WL1 is boosted to the high voltage Vpp. Therefore, the threshold voltage of the memory transistor MQ1 does not vary. Thus, writing terminates.

Next, a circuit diagram showing the internal construction of the Vpp generator (high-voltage generator) 44 shown in FIG. 5 will be described with respect to FIG. 8.

The gate and drain of a transistor M1 are connected to each other, and a capacitor C1 is connected to that junction. The source of the transistor M1 is connected to the drain of a transistor M2 in the next stage. The gate and drain of the transistor M2 are connected to each other, and a capacitor C2 is connected to that junction. Clock signals CLK2 and CLK1 that are 180° out of phase with each other are fed to the ends of the capacitors C1 and C2 that are not connected with the drains of the transistors M1 and M2. Transistors are concatenated in multiple stages in the above manner. The drain of the transistor M1 at the first stage is connected to the source of a transistor M4. The drain of the transistor M4 is connected to a supply voltage Vcc, and the gate of the transistor M4 is controlled by the output signal of a control unit 37. The source current of the transistor M3 at the final stage is provided as an output of a charge pump. A high voltage Vpp that is an output of the Vpp generator 44 is fed to the Vpp switches 40a to 40d, 46e and 46f over a high-voltage line VPPL. According to a control signal, a control gate line CCL1 or CCL2, a bit line BL1 or BL2, and a word line WL1 or WL2 are boosted to a high voltage. A transistor M7 discharges the high voltage Vpp in response to a signal sent from the control unit 37.

A waveform shaping circuit 200 will be described later.

Next, the construction of a high-voltage switch shown in FIG. 7 will be described with respect to the high-voltage switch 40c. The other high-voltage switches have the same construction as the high-voltage switch 40c and, therefore, will not be described.

A high voltage is fed to the drain of a transistor M5. The source of the transistor M5 is connected to the drain of a transistor M6 that is connected as a diode and to one electrode of a capacitor C4. In a diode connection, a gate and a drain of a transistor are connected together so that across the source and drain, the transistor functions as a diode. The source of the transistor M6 is connected with the gate of the transistor M5 and to a bit line BL1. A program clock signal CLKP is fed to the other electrode of the capacitor C4. Clock signals that are in phase with each other are fed to clock signal lines CLKP and CLK2. A clock signal that is 180° out of phase with the clock signal is fed to a clock signal line CLK1 (See FIG. 8).

Next, the operations of the Vpp generator 44 and the high-voltage switch 40c will be described. In a Vpp generator 44 shown in FIG. 8, when a clock signal CLK2 is low, a capacitor C1 is charged. Then, the CLK2 rises. The charge applied to the capacitor C1 passes through a transistor M1 and enters a capacitor C2. Next, the CLK2 falls and a CLK1 rises. Then, the capacitor C1 is charged. At this time, charge applied to the capacitor C2 is sent to a capacitor at the next stage. However, since a transistor M2 acts as a diode, the charge will not be sent to the capacitor C1. Thus, charges are sent subsequently according to the clock signals CLK1 and CLK2. As a result, a boosted voltage is fed to an output of a charge pump.

In the high-voltage switch 40c of FIG. 7, when a column latch 39a is high and a signal BTTR is high, a signal on a bit line BL1 rises. When the signal CLKP is low, the transistor M5 is turned on. Then, the capacitor C4 is charged with a high voltage Vpp until the transistor M5 is turned off. Then, when the signal CLKP rises, charges stored in the capacitor C4 flow through a transistor M6 to the bit line BL1. Then, the gate potential of the transistor M5 connected to the bit line BL1 goes up, and the capacitor C4 is charged with the high voltage Vpp until the transistor M5 is turned off (at this time, the signal CLKP is low). This operation is repeated. Thus, the bit line BL1 is boosted to the high voltage Vpp according to the signal sent from the column latch 39a.

The other Vpp switches operate similarly to the high-voltage switch 40c.

Clock signals CLK1, CLK2, CLKW, CLKE, and CLKP are generated on the basis of a signal sent from the oscillator 45 as well as the erasing cycle signal ERS and program cycle selection signal PRS.

As described above, a high voltage is applied to a control gate or drain of the memory transistor MQ via the selection transistor SQ.

However, when an output of a high-voltage (Vpp) switch is applied to the control gate 26 or to a drain 22 of the memory transistor MQ, the leading edge of an output wave of a high voltage Vpp rises abruptly because of its small time constant. This greatly damages a tunnel oxide film 48a. At the worst, the tunnel oxide film 48a is destroyed.

To alleviate the damage to the tunnel oxide film 48a, the time constant of the leading edge must be reasonably large. For this purpose, a waveform shaping circuit is installed in the Vpp generator 44.

FIG. 8 further shows a waveform shaping circuit 200.

In FIG. 8, an output voltage Vpp of a Vpp generator 44 is divided using capacitors C11 and C12. The divided output is fed as a sample signal to a negative input port of a comparator 220 over a connection line L1. On the other hand, an output voltage of a supply voltage Vcc is fed to a positive input port of the comparator 220 via a switched capacitor 210 over a connection line L2.

The switched capacitor 210 is made up of transistors T211 and T212 connected in series between the supply voltage Vcc and connection line L2, a capacitor C14 connected between the junction of the transistors T211 and T212 and ground, and a capacitor C13 connected between the connection line L2 and the ground. A clock signal $\phi$ and a reverse clock signal $\bar{\phi}$ are fed to the gates of the transistors T211 and T212. The drain of the transistor T212 is connected with the supply voltage Vcc, and the source of the transistor T212 is connected to the connection line L2.

In the foregoing construction, the waveform of the leading edge of an output voltage of a supply voltage Vcc is reshaped according to the clock signal $\phi$ of the switched capacitor 210 and the time constant determined by the capacitors C13 and C14. A voltage whose waveform is reshaped is fed as a reference voltage to a positive input port of the comparator 220.

The comparator 220 generates a feedback signal SF to indicate the difference between the aforesaid output voltage of the Vpp generator 44 from the reference voltage. Based on the feedback signal SF, the clock signals CLK1 and CLK2 are controlled so that the output of the Vpp generator 44 will be boosted to a high voltage while having a leading edge shaped similarly to the reference voltage.

The constructions and operations of an EEPROM and its peripheral circuits have been described so far. FIG. 10 shows a construction of a semiconductor substrate on which a conventional semiconductor integrated circuit is formed to provide a microcomputer having a built-in EEPROM. FIG. 10A shows a layout of functional blocks formed on a semiconductor substrate. FIG. 10B schematically shows a cross section taken along line XB—XB of FIG. 10A. In FIGS. 10A and 10B, 100 denotes a semiconductor substrate on which a semiconductor integrated circuit is formed. 101 denotes a CPU. 102 denotes a ROM or RAM. 103 denotes a universal asynchronous receiver/transmitter (UART) serving as an input/output unit. 104 and 105 denote EEPROM control systems. 107 denotes an EEPROM memory cell array. 108 denotes an EEPROM peripheral high-voltage system. 110 denotes an n-well region. 11 is a p-type substrate region.

The EEPROM memory cell array 107 corresponds to a memory cell array 31 in FIG. 5 and to four portions each of which is made up of a memory cell MC and a transistor T and enclosed with a dashed line in FIG. 7. The peripheral high-voltage system 108 corresponds to Vpp switches 40 and 46, a Y gate 35, and part of a Vpp generator 44 (high-voltage unit), which are shown in FIG. 5. Alternatively, the peripheral high-voltage system 108 corresponds to the peripheral high-voltage system 108 includes Vpp switches 40a to 40d, 46e, and 46f, and transistors T5 to T18, T51, T52, T61, T62, T71, and T72, which are shown in FIG. 7, as well as transistors M1 to M4 and M7, and capacitors C1 to C3. C11, and C12, which are part of the Vpp generator shown in FIG. 8. Then, the EEPROM control systems 104 and 105 correspond to a write buffer 36, a sense amplifier 41, an output buffer 42, a data latch 43, a column decoder 33, a row decoder 32, an address latch 34, a column latch 39, a control unit 37, a timer 38, an oscillator 45, and the remaining portion of the Vpp generator 44, which are shown in FIG. 5. Alternatively, the EE- PROM control systems 104 and 105 correspond to a write buffer 36, a sense amplifier 41, buffers BF1 to BF7, a column decoder 33, a row decoder 32, and column latches 39a to 39d, which are shown in FIG. 7, as well as a waveform shaping circuit, which is shown in FIG. 8, except for capacitors C11 and C12.

As illustrated, in a conventional semiconductor integrated circuit for a microcomputer having a built-in EEPROM, the n-well region 110 is created on part of the semiconductor substrate 100. A p-channel transistor is formed in the n-well region, and an n-channel transistor is formed in the remaining p-type substrate region. Then, the CPU 101, ROM/RAM 102, UART 103, and EEPROM control systems 104 and 105, which are shown in FIG. 10A, are configured as CMOS circuits. The EEPROM memory cell array 107 and peripheral high-voltage system 108 are formed in the p-type substrate region 111.

A conventional semiconductor integrated circuit for a microcomputer having a built-in EEPROM has the aforesaid construction. To shorten development time and evolve a variety of products, a microcomputer having a built-in EEPROM must be interchangeable with a normal microcomputer without an EEPROM so that the pattern layout of the normal microcomputer can be used without modification. Incorporation of a highly-integrated microcomputer is a must in reducing chip size.

To further facilitate micromachining, the concentration of impurities in a semiconductor substrate must be increased. A semiconductor integrated circuit for a microcomputer without the latest EEPROM has a twin-well structure in which a n-well region and a p-well region are created. However, a high concentration of impurities in a semiconductor substrate intensifies the substrate effect. If a circuit having a built-in EEPROM, which has been described as the prior art, is formed on a semiconductor substrate having a twin-well structure, the circuit does not operate. The substrate effect is an effect in which, as a source potential rises, the threshold voltage of a transistor, Vth, increases. In an EEPROM in which a source potential is a high voltage, especially, the rise in source potential must be kept as low as possible. For this reason, it is difficult in the prior art to incorporate an EEPROM in a semiconductor integrated circuit for a microcomputer that has a twin-well structure enabling high density integration of circuits.

SUMMARY OF THE INVENTION

The present invention attempts to solve the aforesaid problem. An object of the present invention is to provide a semiconductor integrated circuit in which an EEPROM is incorporated in a microcomputer having the latest twin well structure that enables high density integration of circuits.

To achieve the foregoing object, the present invention provides a single semiconductor integrated circuit comprising at least an EEPROM memory array having a plurality of memory cells, each memory cell including a nonvolatile memory transistor in which data can be written, and data can be erased electrically arranged in the form of a matrix, means for generating a high voltage necessary for writing data in and erasing data from the memory cell array, means for supplying the high voltage selectively to a memory cell, and means for controlling writing data in reading data from, and erasing from the memory cell array. The memory cell array, the high-voltage generating means, and the high-voltage supplying means are part of a peripheral high-voltage system of the memory cell array in a p-type semiconductor substrate and having an NMOS structure in an n-type semiconductor substrate and has a PMOS structure. The control means to which no high voltage is applied is formed as a CMOS in a twin-well region using a p well and an n well that are created on the semiconductor substrate.

According to the invention, in a semiconductor integrated circuit the EEPROM memory cell array, the high-voltage generating means, and the high-voltage supplying means are part of a peripheral high-voltage system of the memory cell array is surrounded with a p-well region or an n-well region that is of the same conductivity type as on the semiconductor substrate.

According to another aspect of the invention, a single semiconductor integrated circuit for a microcomputer, comprising a CPU for processing data, a ROM for storing programs, a RAM for temporarily storing data, an input/output unit for transferring data to and from external units, an EEPROM memory cell array in which a plurality of memory cells each including a nonvolatile memory transistor in or from which data can be written or erased electrically are arranged in the form of a matrix, a high-voltage generator that generates a high voltage necessary for writing or erasing data in or from the memory cell array, an EEPROM peripheral high-voltage system including a high-voltage supplier that supplies the high voltage selectively to any of the memory cells, EEPROM control systems that control writing data in, reading data from, and erasing data from the memory cell array under the control of the CPU, and system bus means interconnecting the above components, a portion which consists or the EEPROM memory cell array and the EEPROM peripheral high-voltage system and to which a high voltage is applied is formed on a p-type semiconductor substrate and has an NMOS structure, or on a n-type semiconductor substrate and has a PMOS structure. The CPU, ROM, RAM, input/output unit, and EEPROM control systems to which no high voltage is applied are formed as CMOSs in a twin-well region using a p well and an n well that are created in the semiconductor substrate.

According to fourth aspect of the invention, a semiconductor integrated circuit for a microcomputer, includes a portion in which the EEPROM memory cell array and EEPROM peripheral high-voltage system are formed that is surrounded by a p-well region or an n-well region that is of the same conductivity type as the semiconductor substrate.

In a semiconductor integrated circuit according to the invention, a portion of a supply voltage Vcc system that includes a control means and to which a high voltage Vpp is not applied has a twin-well structure. This structure achieves a line width of 1 $\mu$m or less, enables micromachining of a circuit, and improves the degree of integration. On the other hand, a portion which includes an EEPROM memory cell array, a high-voltage generating means, and a high-voltage supplying means of a peripheral high-voltage system of the memory cell array, and to which a high voltage Vpp is applied is formed, for example, on a p-type semiconductor substrate and has an NMOS structure. This structure minimizes the substrate effect and enables a charge pump, Vpp switches, and memory cells to operate normally.

According to the invention, in the integrated circuit, a p-type substrate region in which the EEPROM memory cell array, the high-voltage generating means, and high-voltage supplying means of the peripheral high-voltage system of the memory cell array are formed and to which the high voltage Vpp is applied is surrounded by a p-well region as small as possible. This structure avoids latch up caused by a floating substrate.

In a semiconductor integrated circuit for a microcomputer according to the third invention, a supply voltage Vcc system which includes a CPU, a ROM, a RAH, an input/output unit, and EEPROM control systems and to which a high voltage Vpp is not applied is formed in a twin-well region. This structure realizes a line width of 1 μm or less, enables micromachining of a circuit, and improves the degree of integration. On the other hand, a portion which includes an EEPROM memory cell array and an EEPROM peripheral high-voltage system and to which the high voltage Vpp is applied is formed, for example, on a p-type semiconductor substrate and has an NMOS structure. This structure minimizes a substrate effect, and enables a charge pump, Vpp switches, and memory cells to operate normally.

According to the invention, in an integrated circuit, the p-type substrate region in which the EEPROM memory cell array and the EEPROM peripheral high-voltage system are formed and to which the high voltage Vpp is applied is surrounded by a p-well region as small as possible. This arrangement avoids a latch-up phenomenon caused by a floating substrate.

BRIEF DESCRIPTION OF THE DRAWINGS

FIG. 5 is a block diagram showing an overall construction of an EEPROM;

DESCRIPTION OF THE PREFERRED EMBODIMENTS

An embodiment of the present invention will be described in conjunction with the drawings.

Figure 1A:
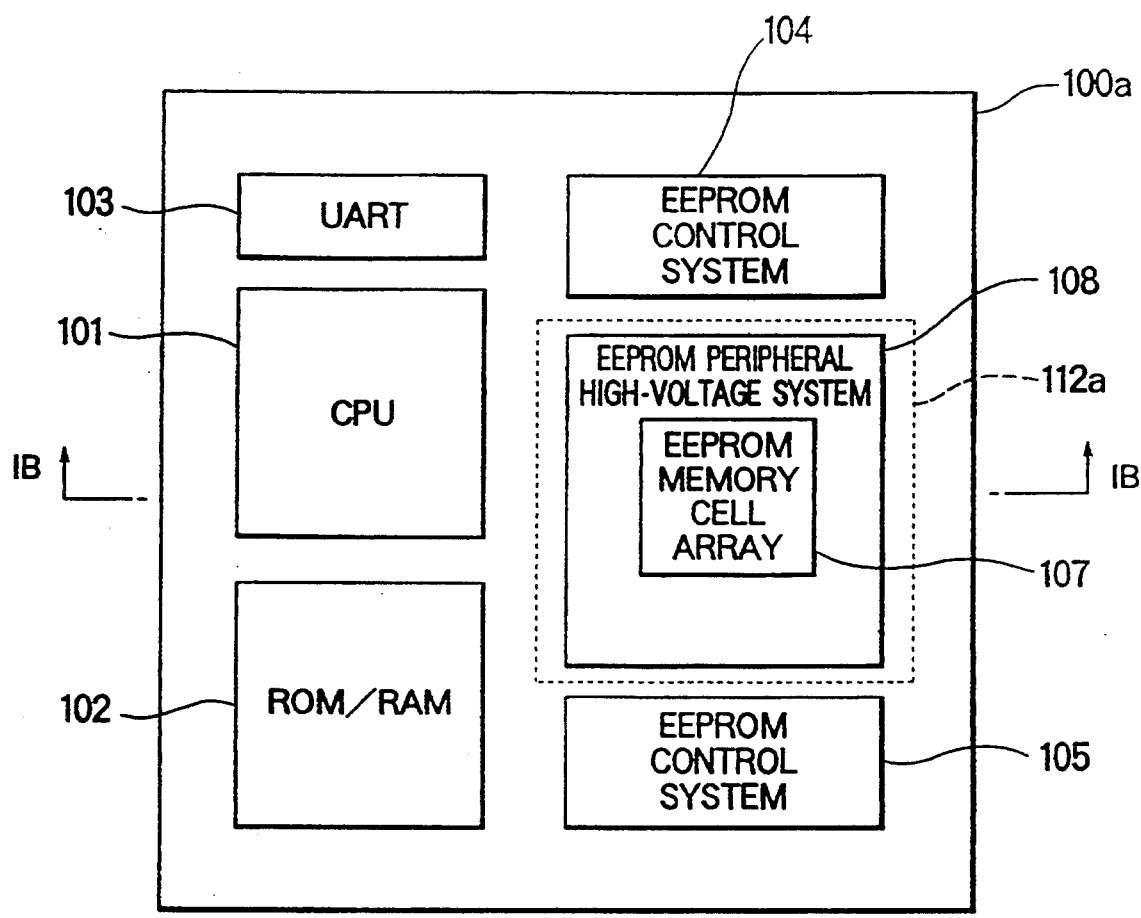
FIG. 1A shows a layout of functional blocks for a semiconductor substrate of a semiconductor integrated circuit for a microcomputer having a built-in EEPROM in which the present invention is implemented, and FIG. 1B schematically shows an IB—IB cross section of FIG. 1A.
Figure 1B:
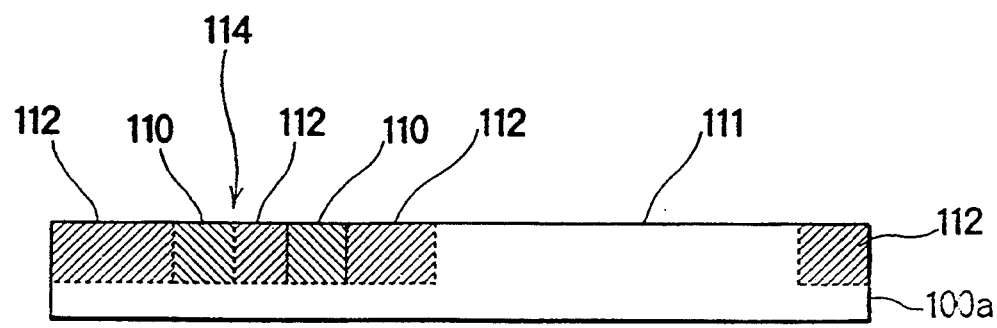

FIGS. 1A and 1B show an embodiment of a semiconductor integrated circuit according to the present invention, that is, a construction of a semiconductor substrate of a semiconductor integrated circuit for a microcomputer having a built-in EEPROM in which the present invention is implemented. FIG. 1A shows a layout of various functional blocks on a semiconductor substrate. FIG. 1B schematically shows a cross section of FIG. 1A taken along line IB—IB. In this embodiment, similarly to the prior art described previously, a semiconductor integrated circuit is formed on a p-type semiconductor substrate. In FIGS. 1A and 1B, 100a denotes a p-type semiconductor substrate on which a semiconductor integrated circuit is formed. 101 denotes a CPU. 102 denotes a ROM or RAM. 103 denotes a UART serving as an input/output circuit. 104 and 105 denote EEPROM control systems. 107 denotes an EEPROM memory cell array. 108 denotes an EEPROM peripheral high-voltage system. 110 denotes an n-well region. 111 denotes a p-type substrate region that is smaller than a conventional one. 112 denotes a p-well region. 114 denotes a twin-well region made up the n-well region 110 and p-well region 112.

As shown in FIGS. 1A and 1B, the CPU 101, ROM or RAM 102, UART 103, and EEPROM control systems 104 and 105 are Formed as CMOSs in the twin-well region 114 made up of the n-well region 110 and the p-well region 112. On the other hand, the EEPROM memory cell array 107 and EEPROM peripheral high-voltage system 108, to which a high voltage Vpp is applied, are formed as NMOSs in the p-type substrate region 111.

The p-type substrate region 111 in which the EEPROM memory cell array 107 and EEPROM peripheral high-voltage system 108 are Formed is, preferably, as indicated with a dashed line 112a in FIG. 1A, surrounded with a p-well region.

Components Formed in the p-type substrate region 111 in the circuitry shown in FIGS. 1A and 1B will be described.

Figure 2:
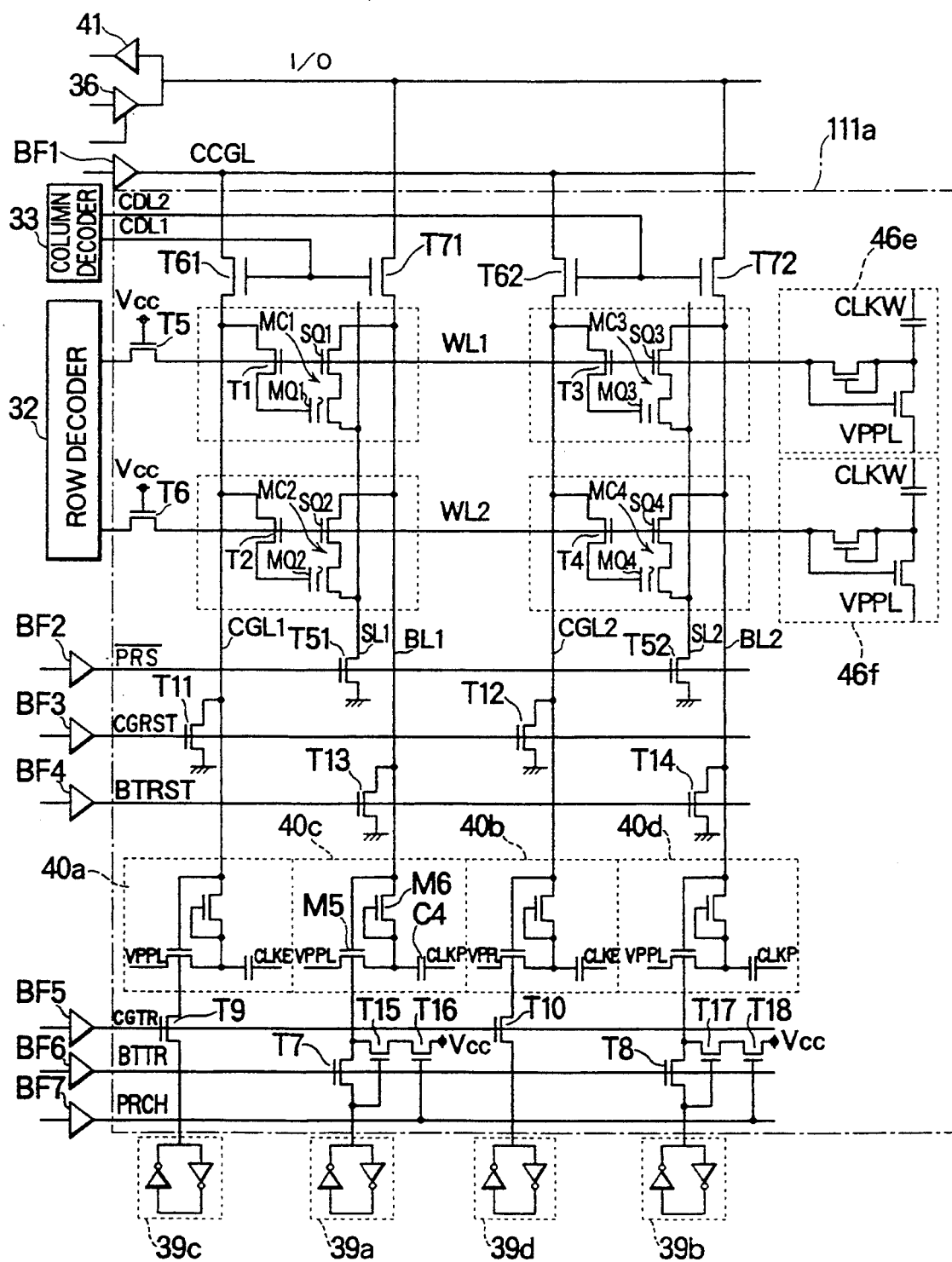
FIG. 2 is a circuit diagram showing a construction of peripheral circuits of an EEPROM memory cell array for a semiconductor integrated circuit of the present invention.
Figure 7:
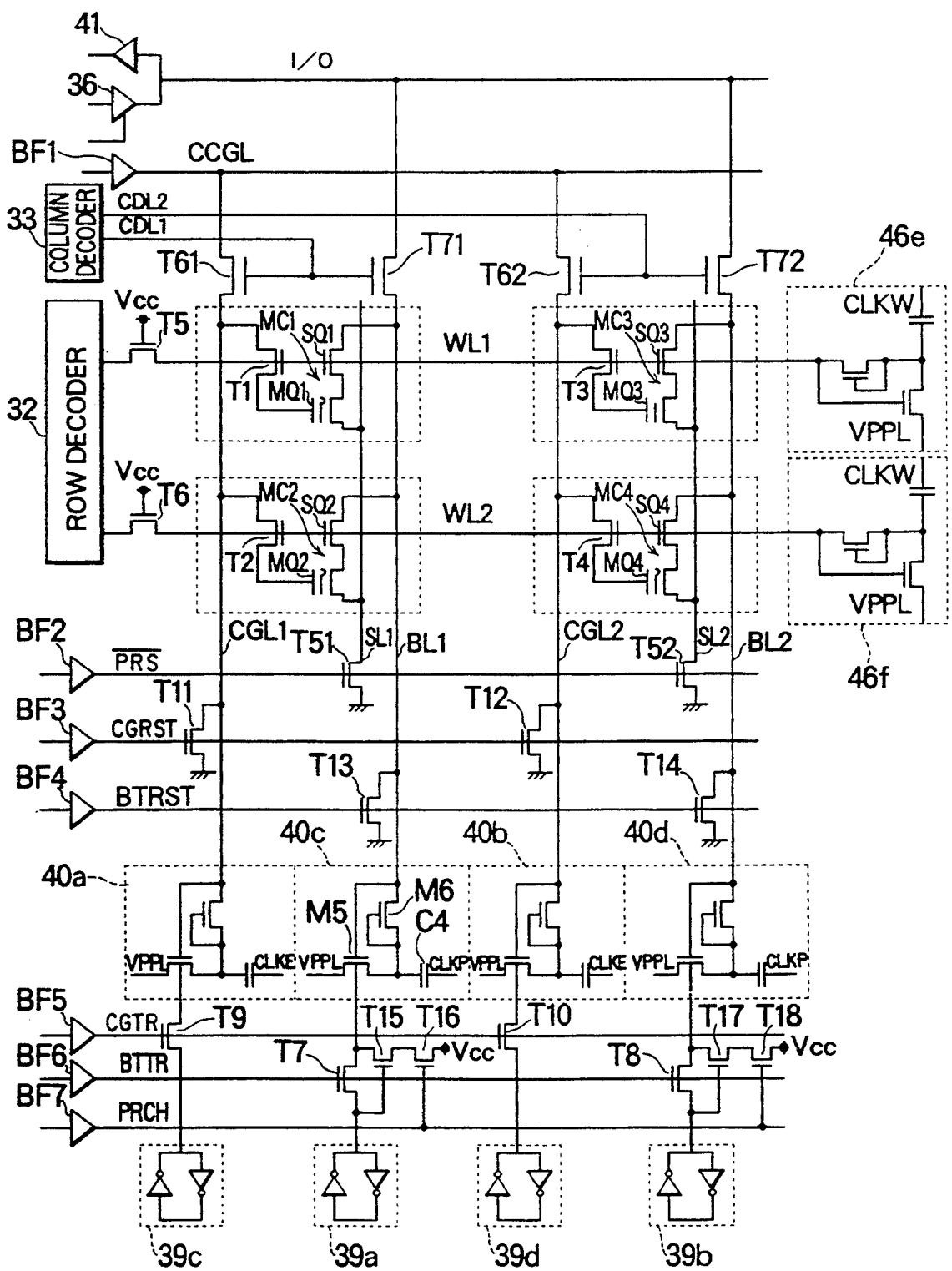
FIG. 7 is a circuit diagram showing a construction of peripheral circuits of a memory cell array of the EEPROM shown in FIG. 5.

FIG. 2 shows circuitry of peripheral circuits of an EEPROM memory cell array in a semiconductor integrated circuit of the present invention. The electrical system of the circuitry is identical to that shown in FIG. 7. In FIG. 2, a section enclosed with a dot-dash line 111a is a portion that is formed in a p-type substrate region 111 and has an NMOS structure, The section 111a includes a portion corresponding to an EEPROM memory cell array and a high-voltage supplying means for supplying a high voltage selectively to a memory cell array. The EEPROM memory cell array includes four memory cells one of which includes, for example, a memory cell MC1 and a transistor T1 and which are enclosed with dashed lines. The high-voltage supplying means includes Vpp switches 40a to 40d, Vpp switches 46e and 46f, high-voltage cutoff transistors T5 and T6, transistors T7 and T8 for connecting column latches 39a and 39b to bit lines BL1 and BL2, transistors T9 and T10 for connecting column latches 39c and 39d to control gate lines CGL1 and CGL2, transistors T11 and T12 for grounding the control gate lines CGL1 and CGL2, transistors T13 and T14 for grounding the bit lines BL1 and BL2, pre-charge transistors T15 to T18, transistors T51 and T52 for grounding source lines SL1 and SL2, and Y-gate transistors T61, T62, T71, and T72.

On the other hand, a sense amplifier 41, a write buffer 36, various buffers BF1 to BF7, a column decoder 33, a row decoder 32, and column latches 39a to 39d are part of a supply voltage Vcc system, to which a high voltage Vpp is not applied. These components belong to the EEPROM control systems 104 and 105 shown in FIG. 1A, which, therefore, are formed as CMOSs in the twin-well region 114.

Figure 3:
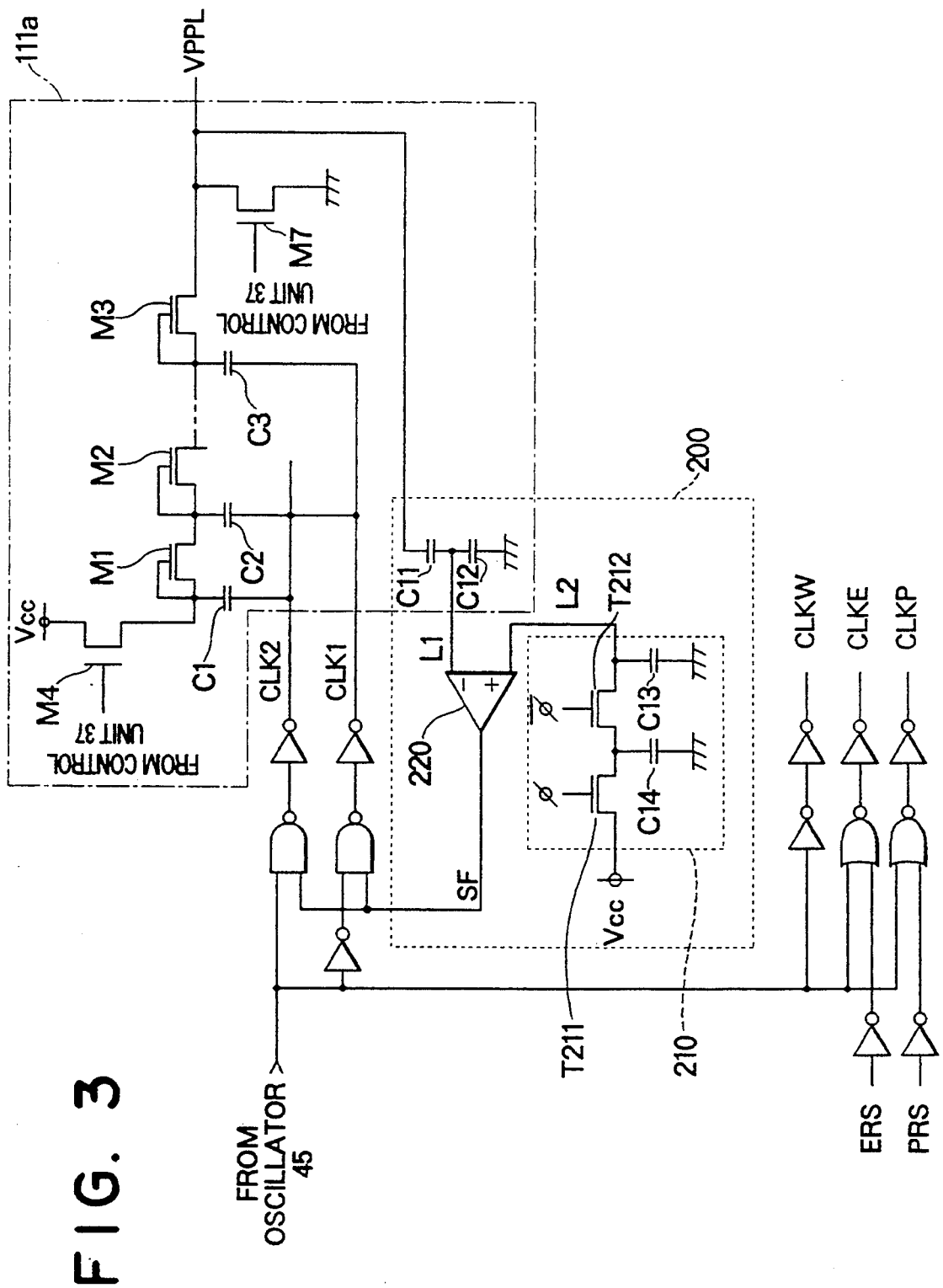
FIG. 3 is a circuit diagram showing a construction of a Vpp generator for a semiconductor integrated circuit of the present invention.
Figure 8:
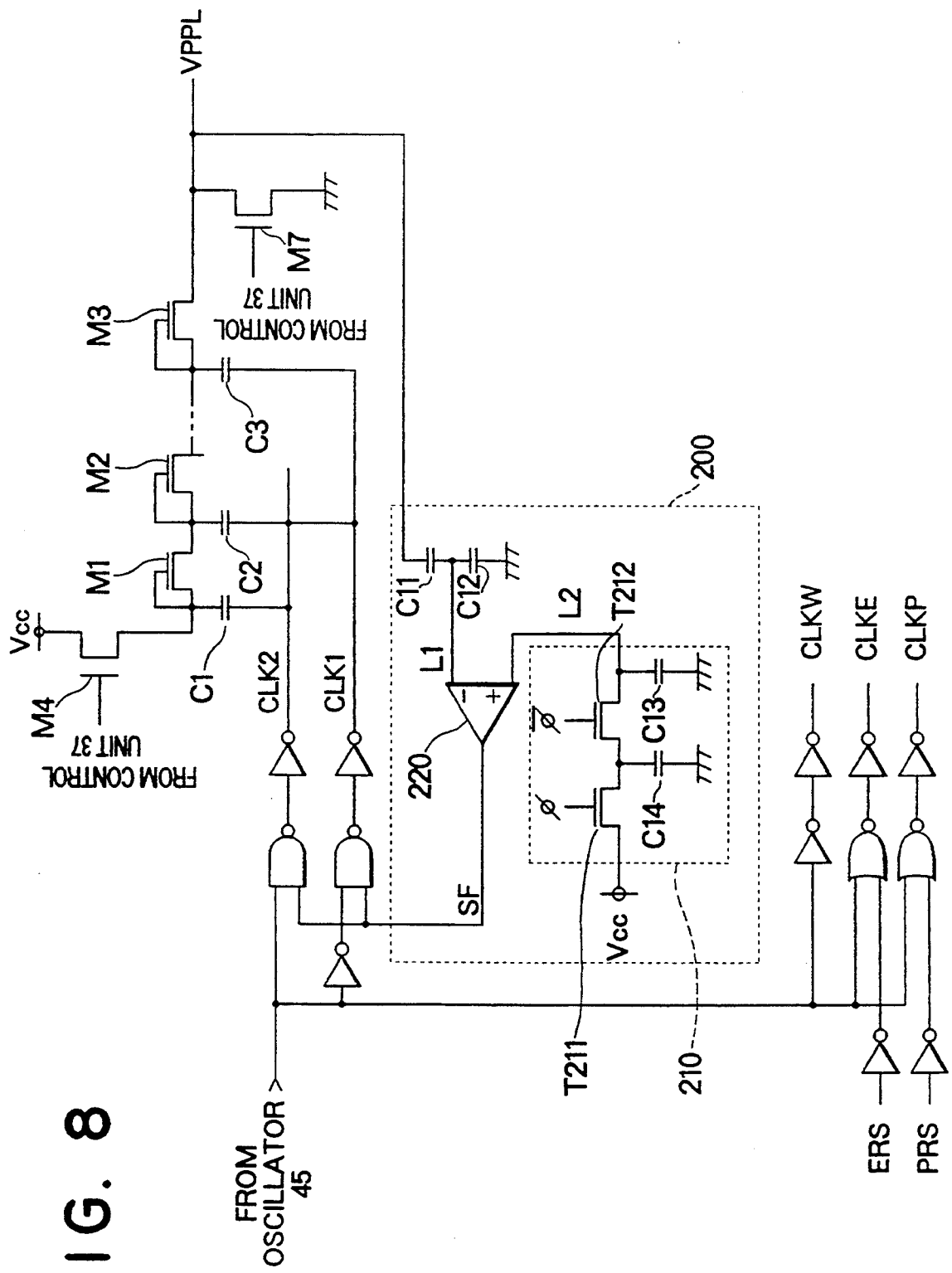
FIG. 8 is a circuit diagram showing a construction of a Vpp generator shown in FIG. 5.
Figure 9:
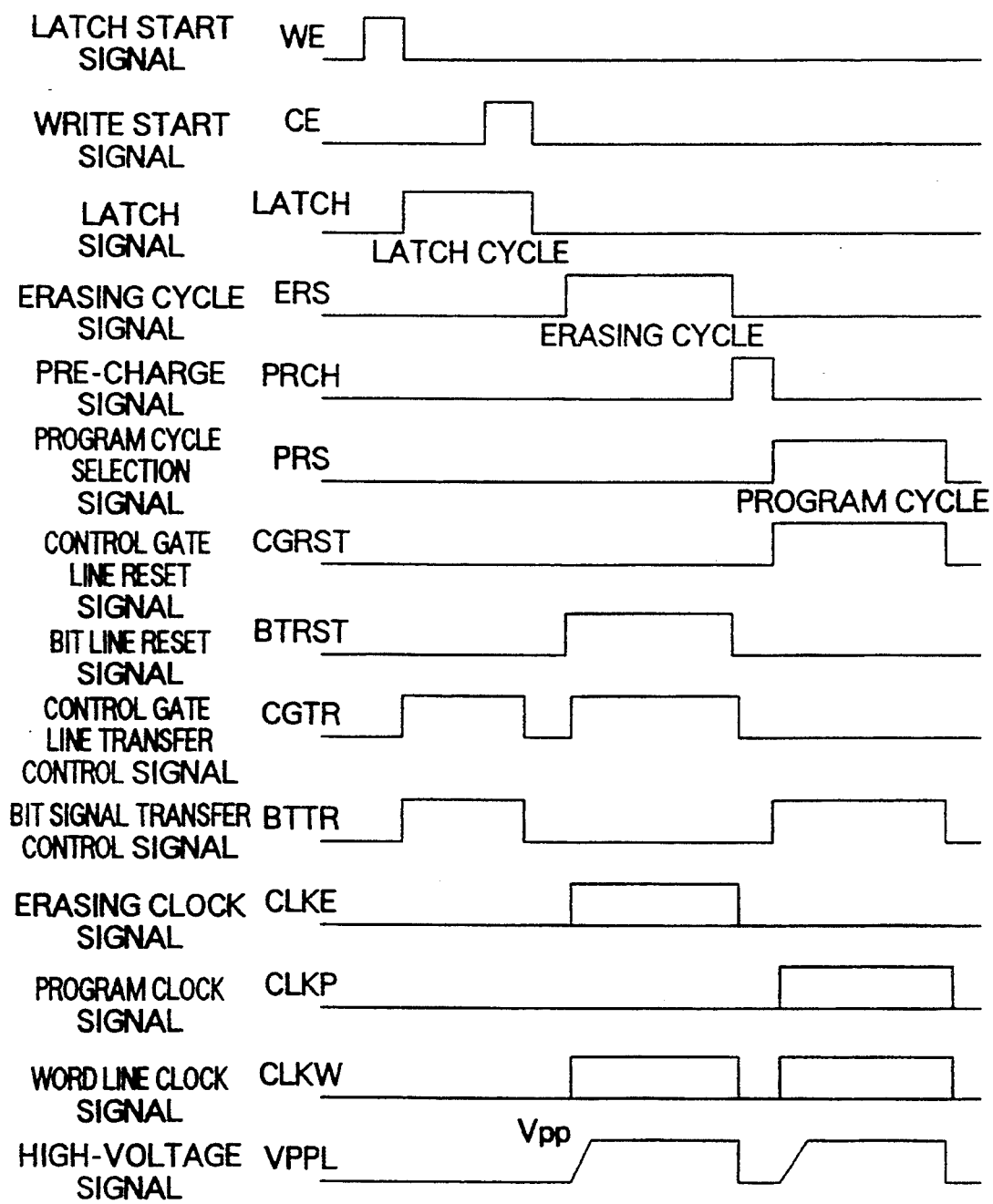
FIG. 9 is a timing chart of various signals during EEPROM writing.
Figure 10A:
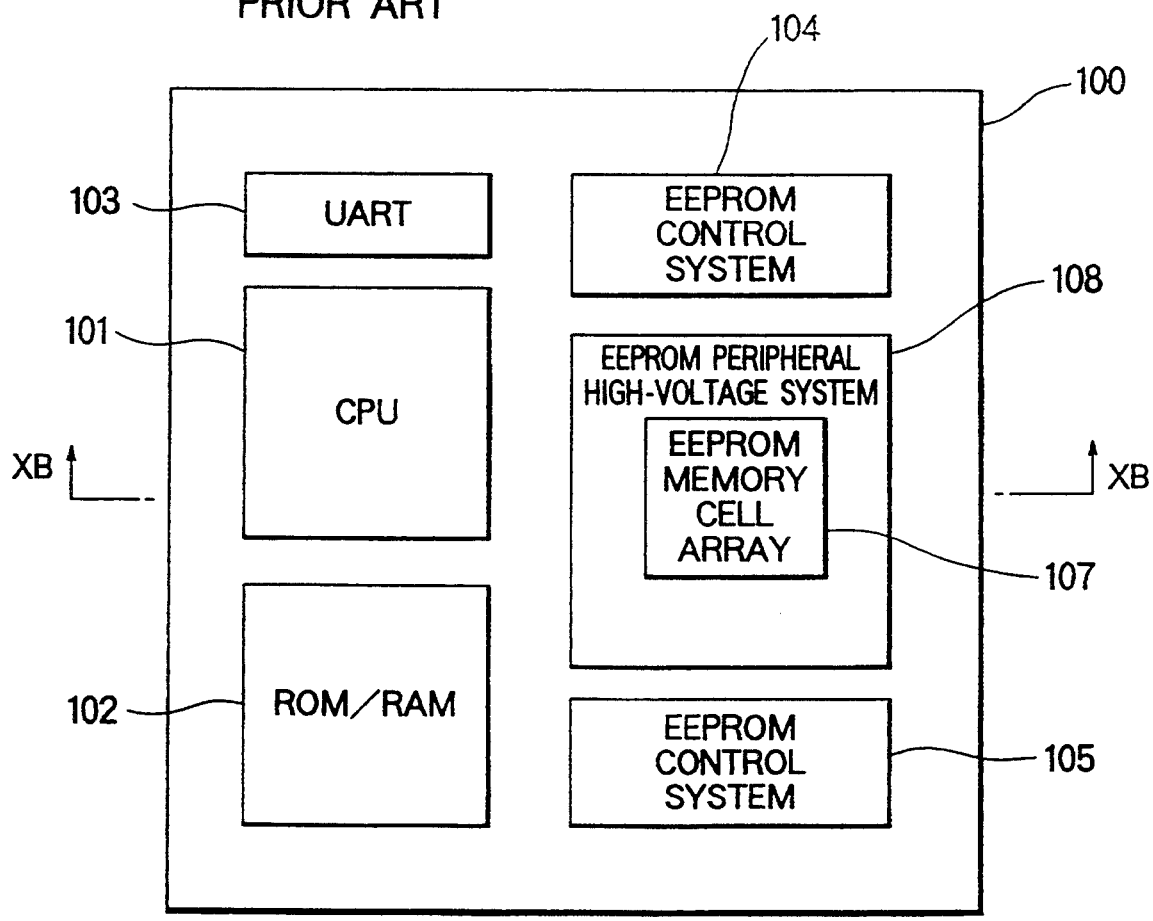
FIG. 10A shows a layout of various functional blocks for a semiconductor substrate of a conventional semiconductor integrated circuit for a microcomputer having a built-in EEPROM, and FIG. 10B schematically shows an XB—XB cross section of FIG. 10A.
Figure 10B:
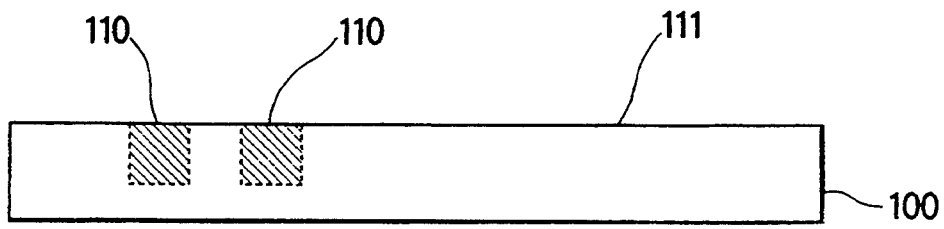

FIG. 3 shows circuitry of a Vpp generator (high-voltage generator) 44 (See FIG. 5) in a semiconductor integrated circuit of the present invention. The electrical system of the circuitry is identical to the conventional system shown in FIG. 8. In FIG. 3, a section enclosed with a dot-dash line 111a is a portion that is formed in a p-type substrate region as an NMOS structure. The region 111a includes a portion corresponding to a high-voltage generating means that generates a high voltage. The high-voltage generating means includes transistors M1 to M4, and capacitors C1 to C3, C11, and C12. On the other hand, a portion including a waveform shaping circuit 200 except capacitors C11 and C12 are part of a supply voltage Vcc system, to which a high voltage Vpp is not applied. That portion relates to the EEPROM control systems 104 and 105, which is, therefore, formed in the twin-well region 114 and has a CMOS structure.

Figure 4:
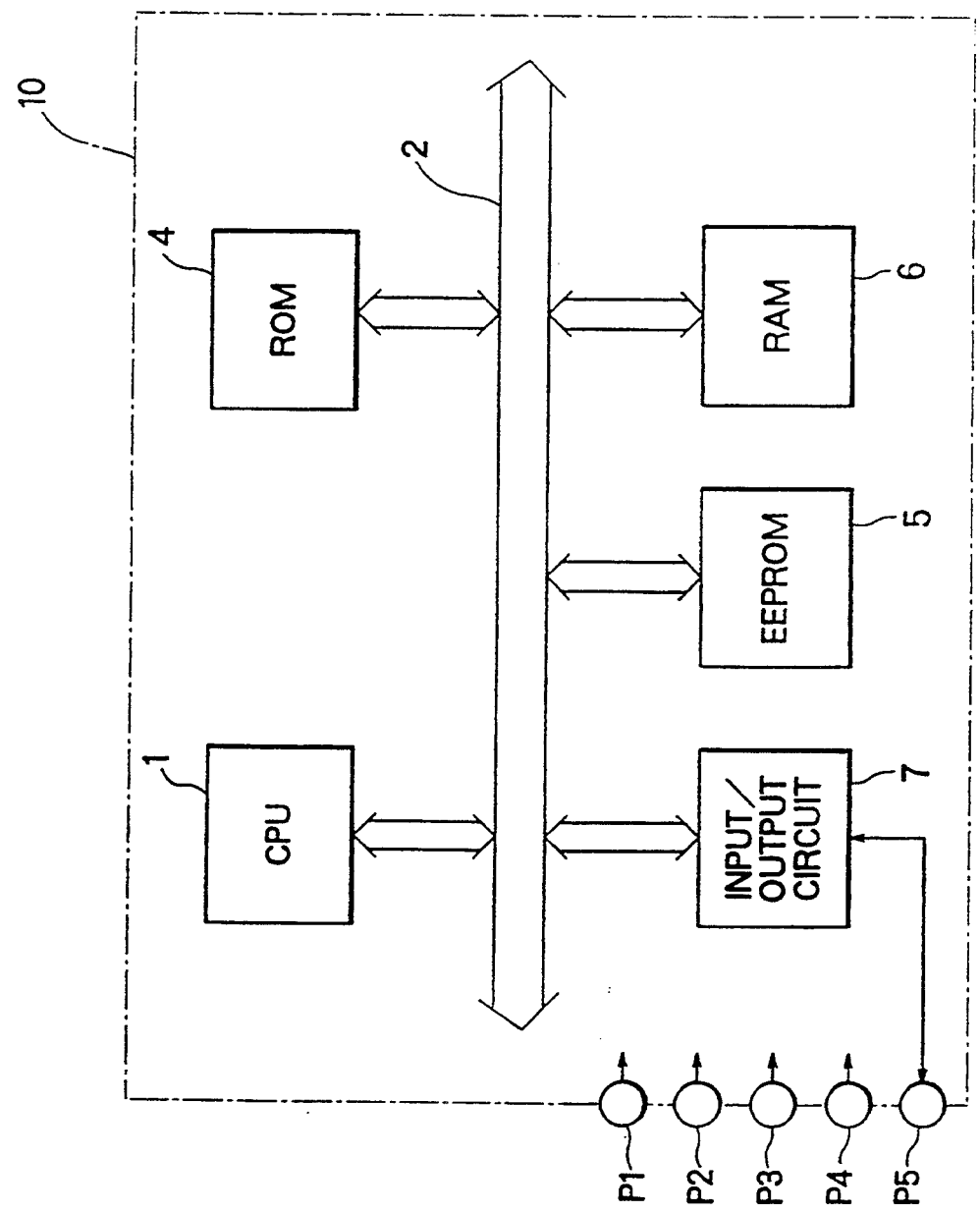
FIG. 4 is a block diagram schematically showing a construction of a general IC card microcomputer having a built in EEPROM.
Figure 6A:
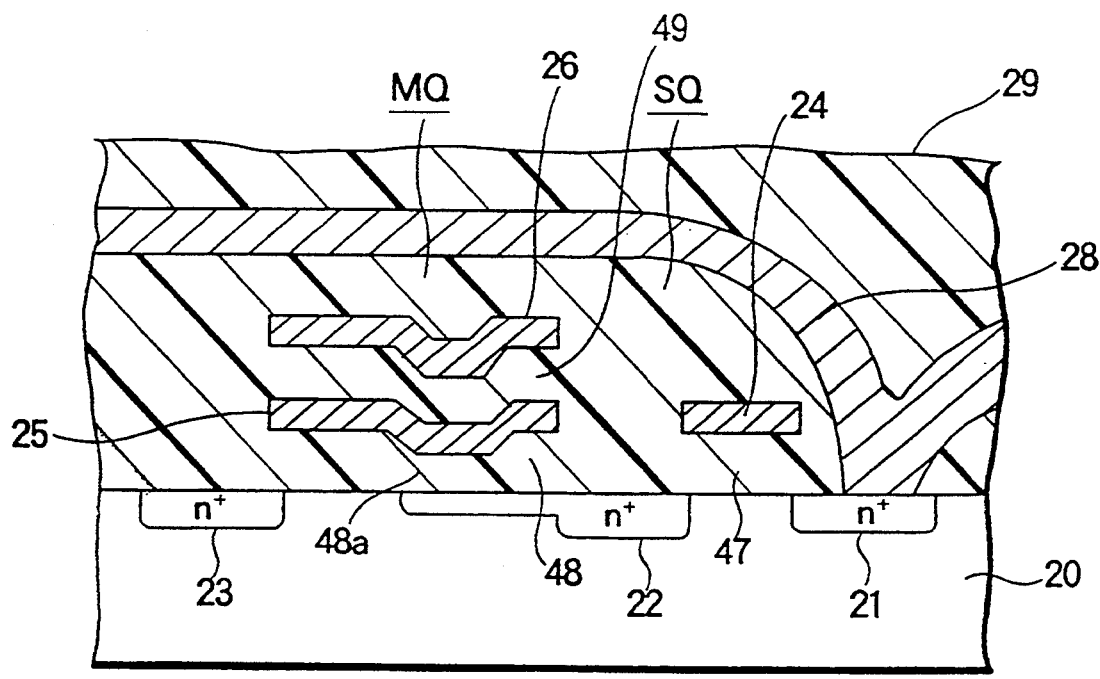
FIG. 6A shows a cross section of a memory cell included in a memory cell array of the EEPROM shown in FIG. 5.
Figure 6B:
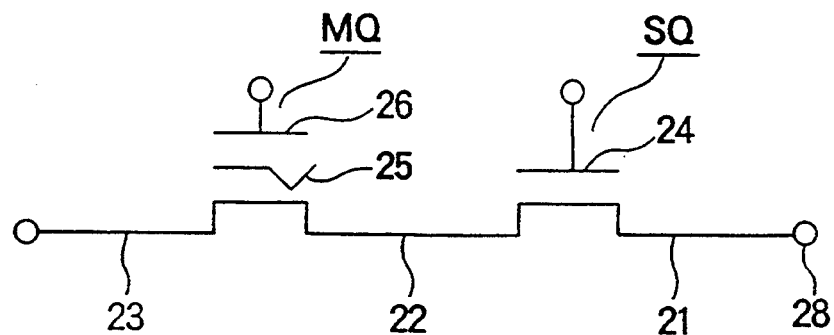
FIG. 6B shows an equivalent circuit.

The EEPROM memory cell array 107 shown in FIG. 1 corresponds to the aforesaid EEPROM memory cell array. The high-voltage peripheral system 108 corresponds to a high-voltage voltage supplying means shown in FIG. 2 or a high-voltage generating means shown in FIG. 3. The EEPROM control systems 104 and 105 (control means or EEPROM control systems) correspond to the circuits of FIG. 5 except sections enclosed with dot-dash lines 111a in FIG. 2 or 3; that is, except for a memory cell array 31, Vpp switches 40 and 46, a Y gate 35, and part of a Vpp generator 44. The system bus shown in FIG. 4 is a system bus means.

As shown in FIGS. 1A and 1B, a CPU 101, a ROM or RAM 102, a UART 103, and EEPROM control systems 104 and 105 are formed in a twin-well region 114 made up of a p-well region 112 and an n-well region 110 that are created in a p-type semiconductor substrate. This provides interchangeability with latest highly-integrated microcomputers. Furthermore, an EEPROM memory cell array 107 and an EEPROM peripheral high-voltage system 108 are formed in a p-type substrate region 111 on the above p-type semiconductor substrate. This minimizes the substrate effect and enables a high-voltage system to operate normally. Specifically, when a portion of a power supply system to which a high voltage is not applied is configured, various circuits that have already been designed for a twin-well structure permitting high density integration can be used. Moreover, an EEPROM can be united with the portion. This helps shorten development time and evolve a variety of products.

When the p-type substrate region 111 is surrounded by a p-well region, the ability to withstand latch-up improves.

In the aforesaid embodiment, a semiconductor integrated circuit is formed on a p-type semiconductor substrate. The present invention is not limited to this type of semiconductor integrated circuit but may be implemented in a semiconductor integrated circuit formed on an n-type semiconductor substrate. When an n-type semiconductor substrate is used, a CPU 101, a ROM or RAM 102, an UART 103. EEPROM control systems 104 and 105 are formed as CMOSs in a twin-well region created on an n-type semiconductor substrate. An EEPROM memory cell array 107 and a peripheral high-voltage system 108 are formed as PMOSs in an n-type substrate region. The n-type substrate region is surrounded with an n-well region.

In the aforesaid embodiment, a semiconductor integrated circuit for a microcomputer having a built-in EEPROM has been described. The present invention is not limited to this type of semiconductor integrated circuit. The present invention can be implemented in any type of semiconductor integrated circuit having a built-in EEPROM, and provides the same advantages as those described previously.

As described so far, in a semiconductor integrated circuit according to the present invention, a p-type substrate region and a twin-well region made up of an n-well region and a p-well region are created. An EEPROM memory cell array and a peripheral high-voltage system, to which a high voltage is applied, are formed as NMOSs in the p-type substrate region. The control system and the other components are formed as CMOSs in the twin-well region. Therefore, the high-voltage system can operate in the p-type substrate region. Various layouts of circuits that are highly integrated and designed in an advanced microcomputer manufacturing process can be adopted for the twin-well region. This helps shorten a development time and evolve a variety of products.

When a p-type substrate region is surrounded by a p-well region, the capability of withstanding latch-up improves, providing a high reliability.

The present invention has the advantage of providing a semiconductor integrated circuit for a microcomputer having the aforesaid construction.

What is claimed is:

1. A single semiconductor integrated circuit comprising:
   a semiconductor substrate;
   an EEPROM memory cell array comprising a plurality of memory cells, each memory cell including a nonvolatile memory transistor in which data can be written and from which data can be erased electrically, said array being arranged in a matrix;
   means for generating a high voltage necessary for writing data in and erasing data from said memory cell array;
   means for supplying said high voltage selectively to said memory cells; and
   means for controlling writing data into, reading from, and erasing data from said memory cell array, wherein said memory cell array, said high-voltage generating means, and said high-voltage supplying means are disposed in a first area of said semiconductor substrate and have an NMOS structure when said semiconductor substrate is p-type and have a PMOS structure when said semiconductor substrate is n-type and wherein said semiconductor substrate includes a first well of the same conductivity type as said substrate peripherally surrounding said first area, a second well of the opposite conductivity type from said substrate, and a third well of the same conductivity type as said substrate, said second and third wells being disposed outside said first area and said first well, and said means for controlling is a CMOS structure disposed within said second and third wells.

2. A single semiconductor integrated circuit microcomputer comprising:
   a semiconductor substrate;

a CPU for processing data;

a ROM for storing programs;

a RAM for storing data temporarily;

an input/output unit for transferring data to and from external units;

an EEPROM memory cell array including a plurality of memory cells, each memory cell including a nonvolatile memory transistor in which data can be written and from which data can be erased electrically, said memory cell array being arranged in a matrix;

a high voltage generator for generating a high voltage for writing data in and erasing data from said memory cell array;

an EEPROM peripheral high-voltage system including a high-voltage supplier for supplying the high voltage selectively to any of the memory cells;

an EEPROM control system for controlling writing data into, reading data from, and erasing data from said memory cell array under control of said CPU; and system bus means interconnecting said CPU, ROM, RAM, input/output unit, and EEPROM memory cell array, wherein said EEPROM memory cell array and said EEPROM peripheral high-voltage system are disposed in a first area of said semiconductor substrate and have an NMOS structure when said semiconductor substrate is p-type and have a PMOS structure when said semiconductor substrate is n-type and wherein said semiconductor substrate includes a first well of the same conductivity type as said substrate peripherally surrounding said first area, a second well of the opposite conductivity type from said substrate, said second and third wells being contiguous to each other and disposed outside said first area and said first well, and said CPU, ROM, RAM, input/output unit, and EEPROM control systems are CMOS structures disposed within said second and third wells.

* * * * *

UNITED STATES PATENT AND TRADEMARK OFFICE
CERTIFICATE OF CORRECTION

PATENT NO. : 5,375,083
DATED : December 20, 1994
INVENTOR(S) : Atsuo Yamaguchi

It is certified that error appears in the above-indentified patent and that said Letters Patent is hereby corrected as shown below:

Column 14, line 49, between "reading" and "from" insert --data--.

Signed and Sealed this

Twenty-fifth Day of April, 1995

Attest:

BRUCE LEHMAN

Attesting Officer        Commissioner of Patents and Trademarks